(12) United States Patent
Liu

(10) Patent No.: US 11,335,409 B2
(45) Date of Patent: May 17, 2022

(54) DATA ERASING METHOD OF NON-VOLATILE MEMORY AND STORAGE DEVICE USING THE SAME

(71) Applicant: Silicon Motion, Inc., Zhubei (TW)

(72) Inventor: Tsai-Fa Liu, New Taipei (TW)

(73) Assignee: SILICON MOTION, INC., Zhubei (TW)

( * ) Notice: Subject to any disclaimer, the term of this patent is extended or adjusted under 35 U.S.C. 154(b) by 0 days.

(21) Appl. No.: 16/896,669

(22) Filed: Jun. 9, 2020

(65) Prior Publication Data

US 2020/0388337 A1 Dec. 10, 2020

(30) Foreign Application Priority Data

Jun. 10, 2019 (TW) .................................. 108119865

(51) Int. Cl.
*G11C 16/14* (2006.01)
*G11C 16/04* (2006.01)
*G06F 13/42* (2006.01)
*G11C 16/30* (2006.01)

(52) U.S. Cl.
CPC .......... *G11C 16/14* (2013.01); *G06F 13/4282* (2013.01); *G11C 16/0483* (2013.01); *G11C 16/30* (2013.01); *G06F 2213/0026* (2013.01); *G06F 2213/0032* (2013.01)

(58) Field of Classification Search
CPC ..... G11C 16/14; G11C 16/0483; G11C 16/30; G11C 5/145; G11C 16/32; G06F 13/4282; G06F 2213/0032; G06F 2213/0026; G06F 3/062; G06F 3/0679
See application file for complete search history.

(56) References Cited

U.S. PATENT DOCUMENTS

| 9,524,788 B1* | 12/2016 | Kutsukake | G11C 5/025 |
| 10,199,112 B1 | 2/2019 | Tran et al. | |
| 2006/0221681 A1* | 10/2006 | Misumi | G11C 16/102 |
| | | | 365/185.01 |
| 2008/0172744 A1* | 7/2008 | Schmidt | H04L 67/125 |
| | | | 726/26 |
| 2017/0317584 A1* | 11/2017 | Tanikawa | H02M 3/073 |
| 2018/0336952 A1 | 11/2018 | Miyazaki | |
| 2019/0206496 A1* | 7/2019 | Chen | G11C 16/22 |

FOREIGN PATENT DOCUMENTS

TW 201239887 A1 10/2012

* cited by examiner

*Primary Examiner* — Ajay Ojha
(74) *Attorney, Agent, or Firm* — Birch, Stewart, Kolasch & Birch, LLP

(57) ABSTRACT

A data erasing method of a non-volatile memory and a storage device using the same are provided. The data erasing method of the non-volatile memory includes the following steps. A boost circuit is boosted to output a damage voltage. A switch is turned on to apply the damage voltage to the non-volatile memory. The switch is connected between the boost circuit and the non-volatile memory. The non-volatile memory is destroyed by the damage voltage.

14 Claims, 5 Drawing Sheets

DATA ERASING METHOD OF NON-VOLATILE MEMORY AND STORAGE DEVICE USING THE SAME

This application claims the benefit of Taiwan application Serial No. 108119865, filed Jun. 10, 2019, the disclosure of which is incorporated by reference herein in its entirety.

TECHNICAL FIELD

The disclosure relates in general to a data erasing method of a non-volatile memory and a storage device using the same, and more particularly to a method for completely erasing memory data and a storage device using the same.

BACKGROUND

Along with the advance in the technology of memory, various storage devices are provided one after another, and the storage capacity also keeps increasing. The user can record data in various storage devices. The storage device has become an important element widely used in various electronic devices.

When a user decides to eliminate a storage device, the user can erase all data originally stored in the storage device. Let the NAND memory be taken for example. Currently, the data stored in the NAND memory is erased by an input/output instruction which erases the data stored in the memory cells of the NAND memory. However, such data erasing process is very time consuming. When the power is interrupted, the data erasing process will also be interrupted, and data will not be erased completely.

Alternatively, the data stored in the NAND memory can also be erased using a logic correspondence table. However, after the data is erased using the logic correspondence table, the memory cells of the NAND memory still keep the data, and the original data can be easily restored.

Therefore, it has become a prominent task for research personnel n the industries to provide a data erasing method of a memory capable of completely erasing data and assuring information security.

SUMMARY

The disclosure is directed to a data erasing method of a non-volatile memory and a storage device using the same. Through circuit design, a high voltage is generated to destroy the non-volatile memory and physically destroy the data. Thus, it can be, assured that the data erasing process will not be interrupted and the data will be completely erased.

According to one embodiment of the present invention, a data erasing method of a non-volatile memory. The data erasing method of the non-volatile memory includes the following steps. A boost circuit is boosted to output a damage voltage. A switch is turned on to apply the damage voltage to the non-volatile memory. The switch is connected between the boost circuit and the non-volatile memory. The non-volatile memory is destroyed by the damage voltage.

According to another embodiment of the present invention, a storage device is provided. The storage device includes a non-volatile memory, a boost circuit, a switch and a control circuit. The switch is connected between the non-volatile memory and the boost circuit. The control circuit is connected to the boost circuit and the switch. The control circuit is configured to boost the boost circuit to output a damage voltage. The control circuit further turns on the switch to apply the damage voltage to destroy the non-volatile memory.

The above and other aspects of the invention will become better understood with regard to the following detailed description of the preferred but non-limiting embodiment(s). The following description is made with reference to the accompanying drawings.

Figure 1:
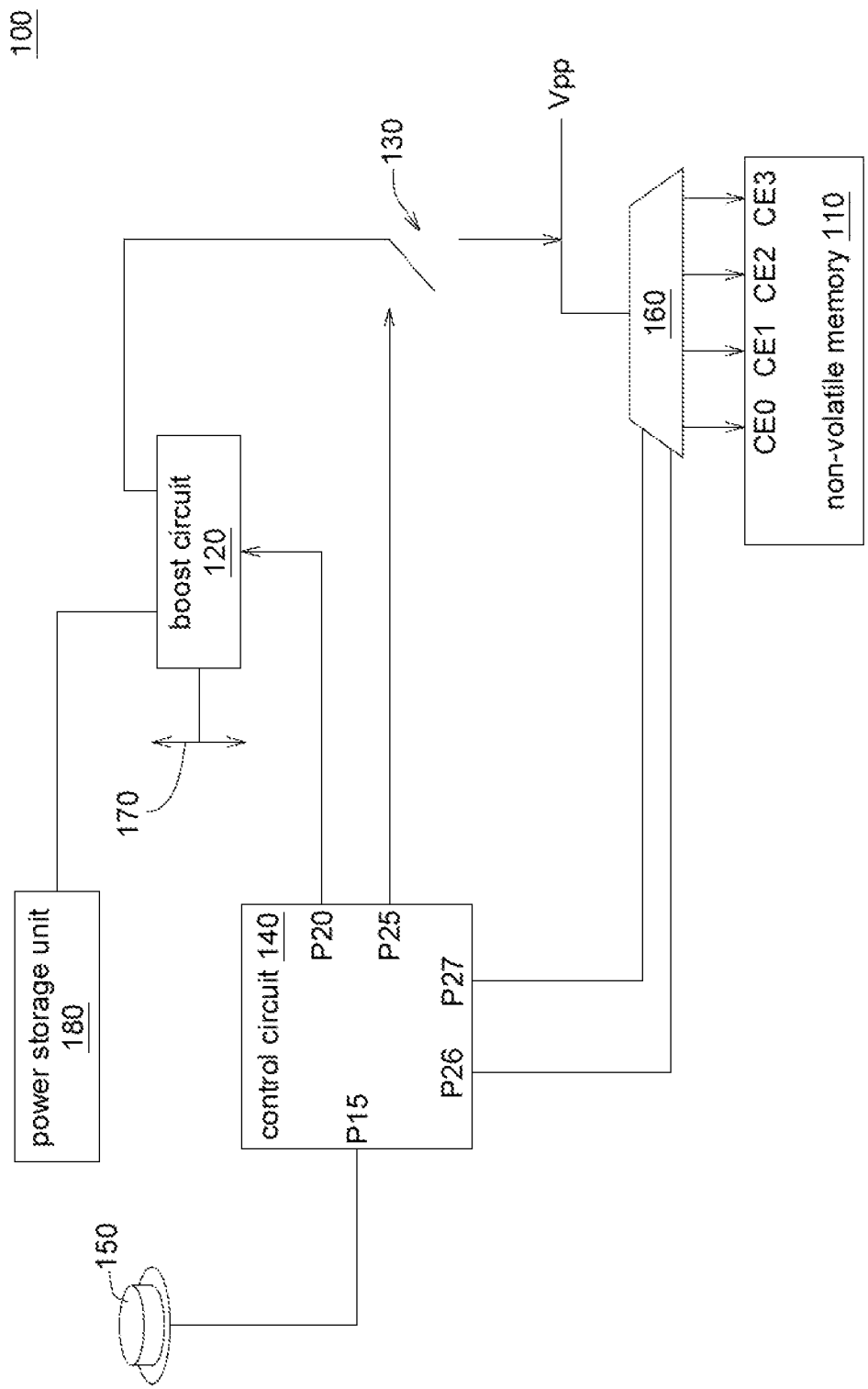
FIG. 1 is a schematic diagram of a storage device according to an embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Referring to FIG. 1, a schematic diagram of a storage device 100 according to an embodiment is shown. The storage device 100 includes a non-volatile memory 110, a boost circuit 120, a switch 130, a control circuit 140, a press-key 150 and a multiplexer 160. The non-volatile memory 110 can be realized by such as a NAND memory. The non-volatile memory 110 is connected to the multiplexer 160. The control circuit 140 is connected to the press-key 150, the multiplexer 160, the boost circuit 120 and the switch 130. The switch 130 is connected between the boost circuit 120 and the multiplexer 160. Through circuit design, a high voltage is generated to destroy the non-volatile memory 110 and physically destroy the data. Thus, it can be assured that the data erasing process will not be interrupted and the data will be completely erased.

Figure 2:
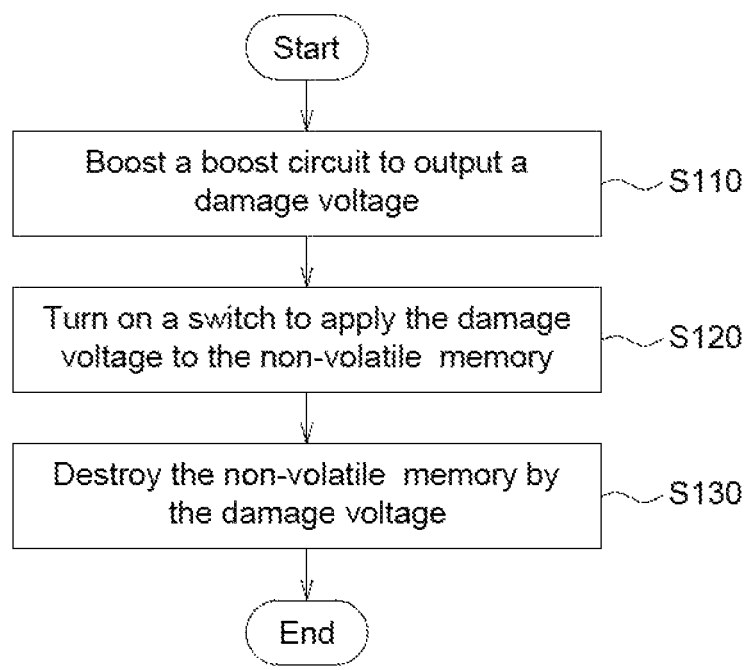
FIG. 2 is a flowchart of a data erasing method of a non-volatile memory according to an embodiment.

Details of the operation of each element of the storage device 100 are disclosed be low with a flowchart. Referring to FIG. 2, a flowchart of a data erasing method of the non-volatile memory 110 according to an embodiment is shown. In step S110, the boost circuit 120 is boosted by the control circuit 140 to output a damage voltage of such as 36V. In an embodiment, the boost circuit 120 is boosted through the power pins of a computer bus 170 (such as a SATA bus or a PCIE bus), wherein the power provided by the power pins is such as 3.3V or 5V. In another embodiment, the storage device 100 further includes a power storage unit 180, such as a high voltage capacitor. After storing power, the power storage unit 180 can also provide a power to the boost circuit 120 whose output end outputs the damage voltage.

Next, the method proceeds to step S120. The switch 130 is turned on by the control circuit 140 to apply the damage voltage outputted by the boost circuit 120 to the non-volatile memory 110. In an embodiment, the damage voltage is applied to a pin of the non-volatile memory 110 which is used to receive the external programming power voltage Vpp. In another embodiment, the damage voltage is applied to a pin of the non-volatile memory 110 which is used to receive the core power supply. In another embodiment, the switch 130 is turned on by a general-purpose input/output (GPIO) signal; or the switch 130 is turned on by the storage device 100 on detecting a power loss.

Then, the method proceeds to step S130. The non-volatile memory 110 is destroyed by a damage voltage. In the present step, the damage voltage is applied to the pin of the non-volatile memory 110 which is used to receive the external programming power voltage Vpp. The damage voltage, being far larger than the voltage limit of the pin receiving the external programming power voltage Vpp, damages the internal circuits of the non-volatile memory 110, such that the object of the invention can be achieved.

As indicated in FIG. 1, the control circuit 140 has a first pin P15, a second pin P20, a third pin P25, a fourth pin P26 and a fifth pin P27. The first pin P15, the second pin P20, the third pin P25, the fourth pin P26 and the fifth pin P27 all are general-purpose input/output (GPIO) pins. The first pin P15 is connected to the press-key 150. The second pin P20 is connected to the boost circuit 120. The third pin P25 is connected to the switch 130. The fourth pin P26 and the fifth pin P27 are connected to the multiplexer 160. The above steps can be controlled through the first pin P15, the second pin P20, the third pin P25, the fourth pin P26 and the fifth pin P27 of the control circuit 140. Detailed descriptions are disclosed below with detailed flowcharts of the data erasing method of the invention.

Figure 3A:
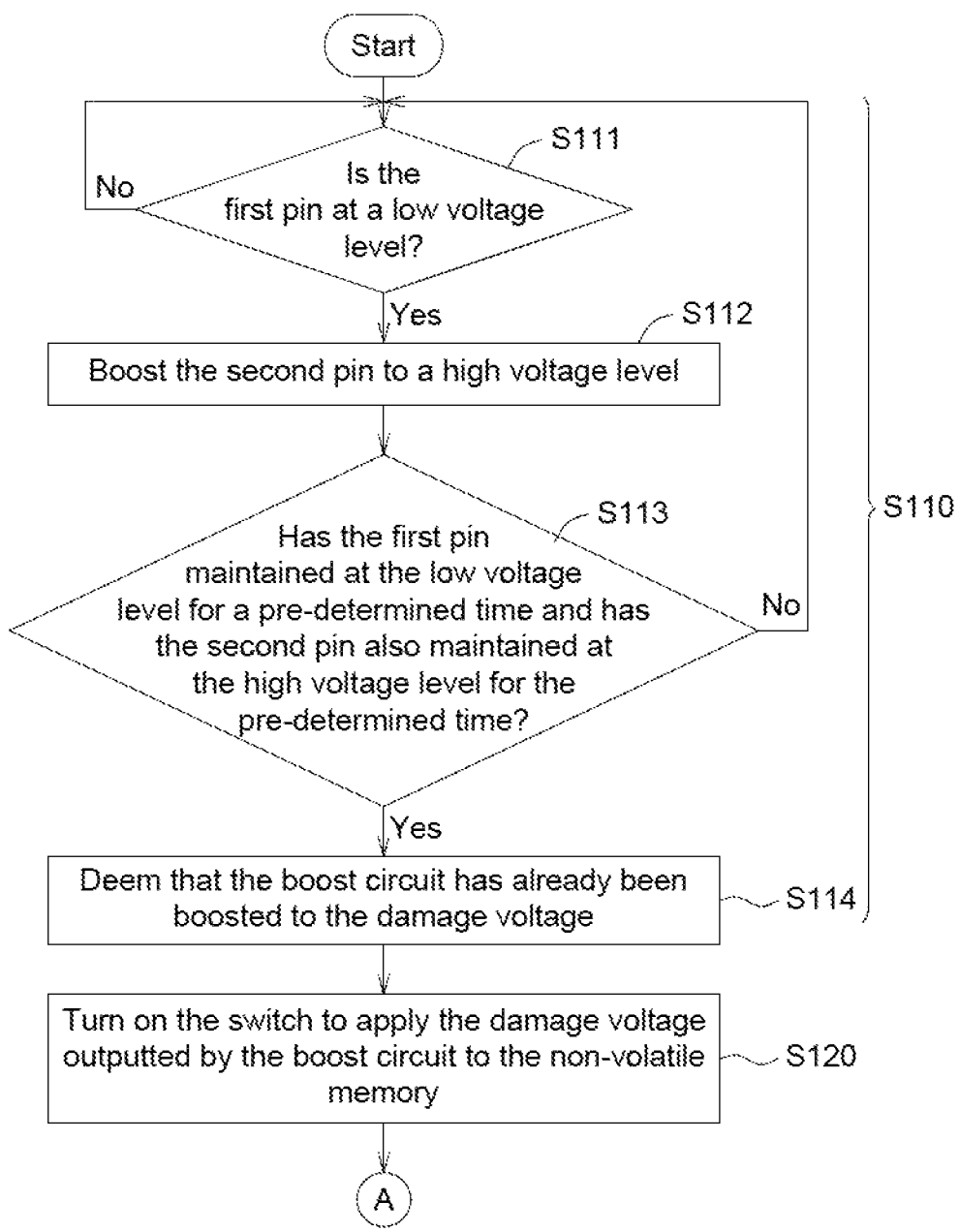
FIGS. 3A to 3B are detailed flowcharts of the data erasing method of a non-volatile memory according to an embodiment.
Figure 3B:
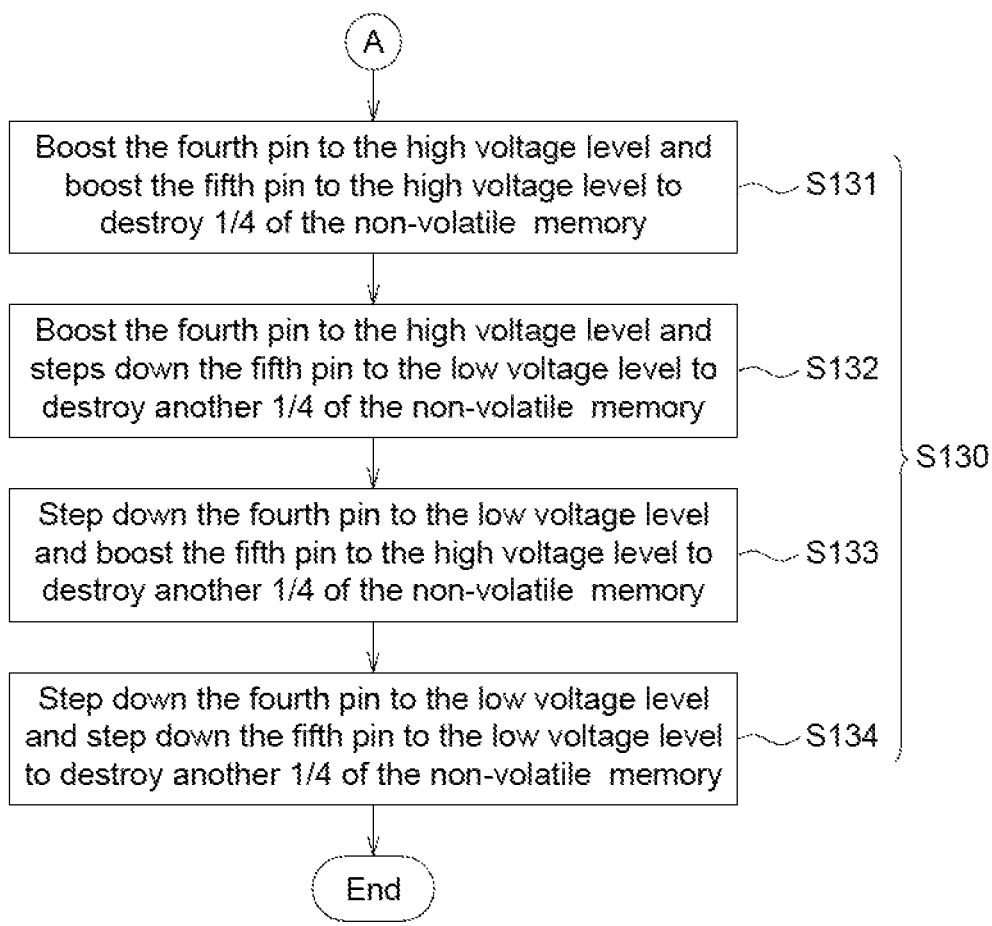
Figure 4:
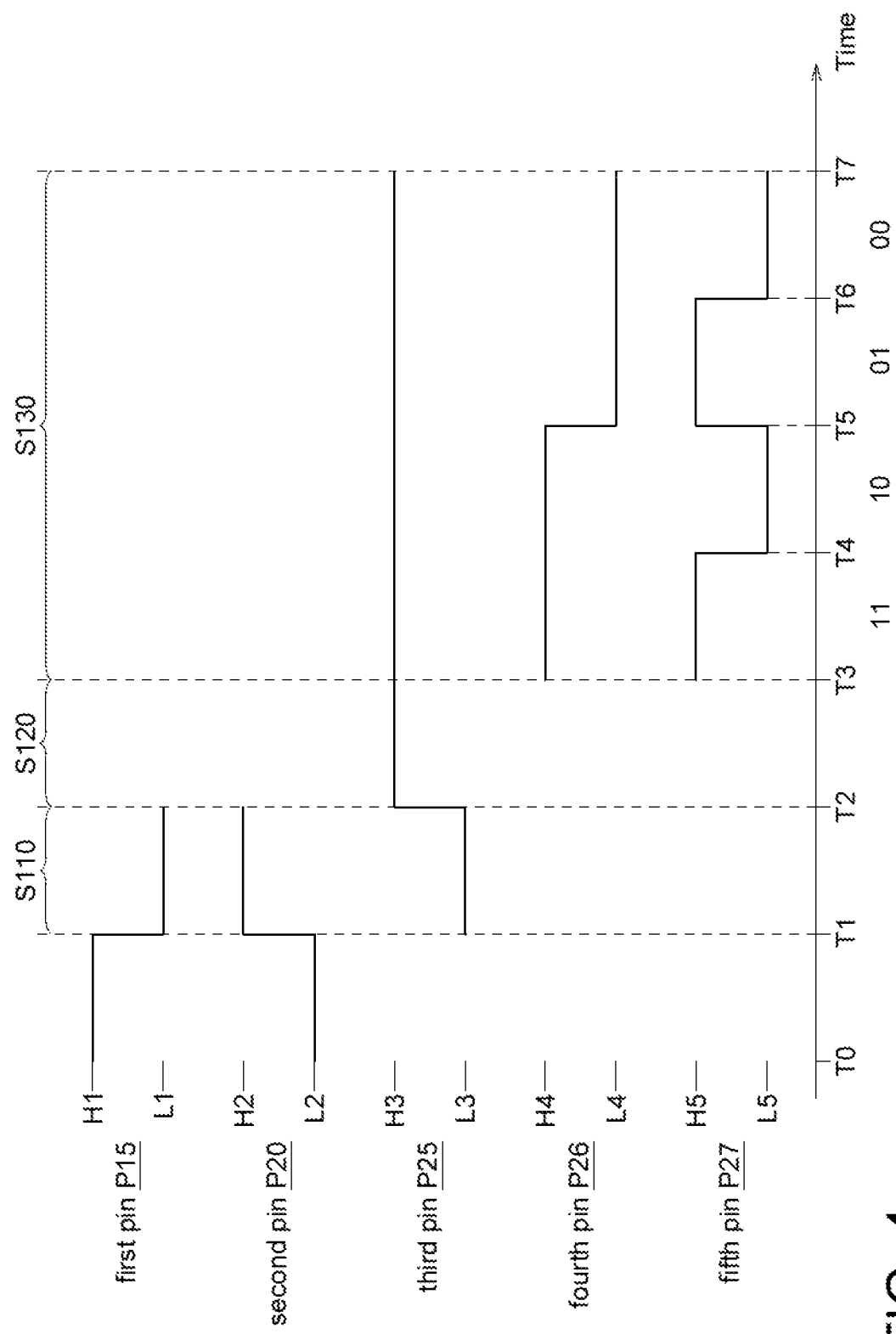
FIG. 4 is a signal diagram according to each step of FIGS. 3A to 3B.

Refer to FIGS. 3A to 3B and 4. FIGS. 3A to 3B are detailed flowcharts of the data erasing method of the non-volatile memory 110 according to an embodiment. FIG. 4 is a signal diagram according to each step of FIGS. 3A to 3B. Step S110 includes steps S111 to S114. In step S111, whether the first pin P15 is at a low voltage level L1 is determined by the control circuit 140. The first pin P15 is connected to the press-key 150. The control circuit 140 can detect whether the press-key 150 is pressed according to ether the first pin P15 is at the low voltage level L1.

As indicated in FIG. 4, at time point T0, the press-key 150 is not pressed, and the first pin P15 is at a high voltage level H1. At time point T1, when the user intends to erase data, the user presses the press-key 150, and the first pin P15 is at the low voltage level L1.

If the first pin P15 is at the low voltage level L1, the method proceeds to step S112; if the first pin P15 is not at the low voltage level L1, the method returns to step S111.

In step S112, the second pin P20 is boosted to a high voltage level H2 by the control circuit 140 to start boosting the boost circuit 120.

As indicated in FIG. 4, at time point T0, the first pin P15 is at the high voltage level H1, and the second pin P20 maintains at the low voltage level L2. At time point T1, the first pin P15 is stepped down to the low voltage level L1, and the second pin P20 is boosted to the high voltage level H2.

Then, the method proceeds to step 3113, whether the first pin P15 has maintained at the low voltage level L1 for a pre-determined time and whether the second pin P20 also has maintained at the high voltage level H2 for the pre-determined time are determined by the control circuit 140. The pre-determined time, such as 3 seconds, is designed to assure that the press-key 150 is not pressed accidently. If the first pin P15 has maintained at the low voltage level L1 for the pre-determined time and the second pin P20 also has maintained at the high voltage level H2 for the pre-determined time, the method proceeds to step S114. If the first pin P15 has not maintained at the low voltage level L1 for the pre-determined time or if the second pin P20 has not maintained at the high voltage level H2 for the pre-determined time, the method returns to step S111, the press-key 150 is regarded as not being pressed. Thus, the data erasing process will not be performed unless it is assured that the user has long pressed the press-key 150.

On the other hand, the pre-determined time also allows the boost circuit 120 to have enough time to be boosted to the damage voltage (such as 36V). Thus, the length of the pre-determined time is not for limiting the invention. The designer can set the length of the pre-determined time according to the time required for long pressing and voltage boosting.

In step S114, it is deemed by the control circuit 140 that the boost circuit 120 has already been boosted to the damage voltage. As indicated in FIG. 4, time point T1 and time point T2 are separated by the pre-determined time; and the first pin P15 is checked by the control circuit 140 at time point T2 to determine whether the press-key 150 is long pressed. At time point T2, the second pin P20 is further checked by the control circuit 140 to determine whether the boost circuit 120 has already been boosted to the damage voltage.

Then, the method proceeds to step S120, the switch 130 is turned on by the control circuit 140 to apply the damage voltage outputted by the boost circuit 120 to the non-volatile memory 110. In an embodiment, the third pin P25 is boosted by the control circuit 140 to a high voltage level H3 to turn on the switch 130. The switch 130 can be realized by such as a transistor. The high voltage level is such as the breakdown voltage of the transistor. As indicated in FIG. 4, at time point T2, the third pin P25 is boosted by the control circuit 140 to the high voltage level H3 from the low voltage level L3 to maintain the switch 130 at a turn-on state.

Afterwards, the method proceeds to step S130, which includes steps S131 to S134. In step S130, the control circuit 140 controls the fourth pin P26 and the fifth pin P27 to destroy 4 parts of the non-volatile memory 110 in order. In an embodiment, the fourth pin P26 being at the high voltage level H4 is presented by "1"; the fourth pin P26 being at the low voltage level L4 is presented by "0"; the fifth pin P27 being at the high voltage level H5 is presented by "1"; and the fifth pin P27 being at the low voltage level L5 is presented by "0". The fourth pin P26 and the fifth pin P27 can have 4 scenarios: "1, 1", "1, 0", "0, 1", and "0, 0". The fourth pin P26 and the fifth pin P27 are connected to the multiplexer 160, such that the damage voltage can be selectively inputted to one of the 4 contacts CE0, CE1, CE2, and CE3.

In step S131, at time point T3, the fourth pin P26 is boosted to the high voltage level H4 and the fifth pin P25 is boosted to the high voltage level H5 to form the scenario of "1, 1"; meanwhile, the damage voltage can be inputted to the contact CE3 through the switching of the multiplexer 160 to destroy ¼ of the non-volatile memory 110.

In step S132, at time point T4, the fourth pin P26 is boosted to the high voltage level H4 and the fifth pin P27 is stepped down to the low voltage level L5 to form the scenario of "1, 0"; meanwhile, the damage voltage can be inputted to the contact CE2 through the switching of the multiplexer 160 to destroy another ¼ of the non-volatile memory 110.

In step S133, at time point T5, the fourth pin P26 is stepped down to the low voltage level L4 and the fifth pin P27 is boosted to the high voltage level H5 to form the scenario of "0, 1"; meanwhile, the damage voltage can be inputted to the contact CE1 through the switching of the multiplexer 160 to destroy another ¼ of the non-volatile memory 110.

In step S134, at time point T6, the fourth pin P26 is stepped down to the low voltage level L4 and the fifth pin P27 is stepped down to the low voltage level L5 to form the scenario of "0, 0"; meanwhile, the damage voltage can be inputted to the contact CE0 through the switching of the multiplexer 160 to destroy another ¼ of the non-volatile memory 110.

Thus, 4 parts of the non-volatile memory 110 are destroyed in order. The design of dividing the non-volatile memory 110 into several parts to be destroyed in order can assure that the damage voltage can completely destroy the data and that the data will not be destroyed incompletely due to the scope of destruction being too large. In another embodiment, the design can use only one pin to implement 2 scenarios: "1" and "0", and the non-volatile memory 110 is divided into 2 parts which are destroyed in order. In another embodiment, the design can use 3 pins to implement 8 scenarios: "1, 1, 1", "1, 1, 0", "1, 0, 1", "0, 1, 1", "1, 0, 0", "0, 1, 0", "0, 0, 1", and "0, 0, 0", and the non-volatile memory 110 is divided into 8 parts which are destroyed in order. By the same analogy, in another embodiment, the design can use N pins to implement $2^N$ scenarios, and the non-volatile memory 110 is divided into $2^N$ parts which are destroyed in order.

According to the embodiments disclosed above, through circuit design, a high voltage is generated to destroy the non-volatile memory 110 and physically destroy the data. Thus, it can be assured that the data erasing process will not be interrupted and the data will be completely erased.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A data erasing method of a non-volatile memory, comprising:
   boosting a boost circuit to output a damage voltage;
   turning on a switch to apply the damage voltage to a pin of the non-volatile memory which receives an external programming power voltage, wherein the switch is connected between the boost circuit and the non-volatile memory; and
   destroying the non-volatile memory by the damage voltage;
   wherein the damage voltage is larger than a voltage limit of the pin receiving the external programming power voltage; and
   wherein a control circuit has a first pin and a second pin; the first pin is connected to a press-key; the second pin is connected to the boost circuit and the step of boosting the boost circuit comprises:
   determining whether the first pin is at a first voltage level;
   if the first pin is at the first voltage level, boosting the second pin to a second voltage level to start boosting the boost circuit;
   determining whether the first pin has maintained at the first voltage level for a pre-determined time and whether the second pin has maintained at the second voltage level for the pre-determined time; and
   if the first pin has maintained at the first voltage level for the pre-determined time, and the second pin has maintained at the second voltage level for the pre-determined time, then deeming that the boost circuit has already been boosted to the damage voltage.

2. The data erasing method of the non-volatile memory according to claim 1, wherein the pre-determined time is three seconds.

3. The data erasing method of the non-volatile memory according to claim 1, wherein the boost circuit is boosted through a SATA bus or a PCIE bus.

4. The data erasing method of the non-volatile memory according to claim 1, wherein the control circuit further has a third pin connected to the switch; in the step of turning on the switch, the third pin is boosted to a third voltage level to turn on the switch.

5. The data erasing method of the non-volatile memory according to claim 4, wherein the control circuit further has a fourth pin and a fifth pin; the fourth pin and the fifth pin are connected to a multiplexer, which is connected between the switch and the non-volatile memory; in the step of destroying the non-volatile memory, the fourth pin and the fifth pin are controlled, such that four parts of the non-volatile memory are destroyed in order.

6. The data erasing method of the non-volatile memory according to claim 5, wherein the first pin, the second pin, the third pin, the fourth pin and the fifth pin all are general-purpose input/output (GPIO) pins.

7. The data erasing method of the non-volatile memory according to claim 1, wherein the damage voltage is 36V.

8. A storage device, comprising:
   a non-volatile memory;
   a boost circuit;
   a switch connected between the non-volatile memory and the boost circuit;
   a control circuit connected to the boost circuit and the switch, wherein the control circuit is configured to boost the boost circuit to output a damage voltage; the control circuit further turns on the switch to apply the damage voltage to a pin of the non-volatile memory which receives an external programming power voltage to destroy the non-volatile memory, the damage voltage is larger than a voltage limit of the pin receiving the external programming power voltage; and
   a press-key, wherein the control circuit has a first pin and a second pin; the first pin is connected to the press-key; the second pin is connected to the boost circuit when the press-key is pressed, the first pin is lower than a first voltage level;
   wherein when the first pin is at the first voltage level, the control circuit boosts the second pin to a second voltage level to start boosting the boost circuit;
   wherein if the first pin has maintained at the first voltage level for a pre-determined time and the second pin has maintained at the second voltage level for the pre-determined time, the control circuit deems that the boost circuit has been boosted to the damage voltage.

9. The storage device according to claim 8, wherein the pre-determined time is three seconds.

10. The storage device according to claim 8, wherein the boost circuit is boosted through a SATA bus or a PCIE bus.

11. The storage device according to claim 8, wherein the control circuit further has a third pin connected to the switch; the control circuit boosts the third pin to a third voltage level to turn on the switch.

12. The storage device according to claim 11, further comprising:
   a multiplexer connected between the switch and the non-volatile memory, wherein the control circuit further has a fourth pin and a fifth pin; the fourth pin and the fifth pin are connected to the multiplexer; the control circuit controls the fourth pin and the fifth pin, such that four parts of the non-volatile memory are destroyed in order.

13. The storage device according to claim 12, wherein the first pin, the second pin, the third pin, the fourth pin and the fifth pin all are general-purpose input/output (GPIO) pins.

14. The storage device according to claim 8, wherein the damage voltage is 36V.

* * * * *